United States Patent
Ahmed et al.

(10) Patent No.: US 10,263,558 B2
(45) Date of Patent: Apr. 16, 2019

(54) PHASE LOSS DETECTION IN ACTIVE FRONT END CONVERTERS

(71) Applicant: Rockwell Automation Technologies, Inc., Mayfield Heights, OH (US)

(72) Inventors: Ahmed Mohamed Sayed Ahmed, Mequon, WI (US); Kanikesh Yedla, Yorktown, VA (US); Zhenyu Ye, Mequon, WI (US); Prathamesh R. Vadhavkar, Brown Deer, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 410 days.

(21) Appl. No.: 15/071,374

(22) Filed: Mar. 16, 2016

(65) Prior Publication Data
US 2017/0272023 A1 Sep. 21, 2017

(51) Int. Cl.
*H02P 27/08* (2006.01)
*H02P 3/00* (2006.01)
(Continued)

(52) U.S. Cl.
CPC .......... *H02P 27/08* (2013.01); *G01R 19/1658* (2013.01); *G01R 29/18* (2013.01);
(Continued)

(58) Field of Classification Search
CPC ....... H02P 27/08; H02M 5/4585; G01R 29/18
(Continued)

(56) References Cited

U.S. PATENT DOCUMENTS

| 7,355,866 B2 | 4/2008 | Hseih et al. |
| 7,480,124 B2 | 1/2009 | Pankau et al. |

(Continued)

FOREIGN PATENT DOCUMENTS

| CN | 104038074 A | 9/2014 |
| CN | 204597784 U | 8/2015 |

(Continued)

OTHER PUBLICATIONS

Rodriguez, Pedro et al. literature titled "Multiple Second Order Generalized Integrators for Harmonic Synchronization of Power Converters", IEEE, 978-1-4244-2893, pp. 2239-2245, 2009.

(Continued)

*Primary Examiner* — Eduardo Colon Santana
*Assistant Examiner* — Gabriel Agared
(74) *Attorney, Agent, or Firm* — Fay Sharpe LLP (57) ABSTRACT

System, apparatus and methods are provided for identifying a phase loss condition in a motor drive. In one example, a power conversion system includes an active rectifier, a switching inverter, and a controller. The controller is operative to generate rectifier switching control signals to operate the rectifier, measure AC input voltage signals and determine grid current signals. If the rectifier circuit is not in a switching mode, the controller identifies a suspected AC input phase loss condition if two of the AC input voltage signals are in phase with one another. If the rectifier is in the switching mode, the controller identifies a suspected AC input phase loss condition if the absolute value of the sum of two of the grid current signals is less than a predetermined non-zero threshold.

22 Claims, 5 Drawing Sheets

(51) Int. Cl.
  *H02M 5/458* (2006.01)
  *G01R 29/18* (2006.01)
  *G01R 19/165* (2006.01)
  *H02M 1/12* (2006.01)
  *H02M 1/32* (2007.01)
  *H02M 7/219* (2006.01)

(52) U.S. Cl.
  CPC ............ *H02M 1/126* (2013.01); *H02M 1/32* (2013.01); *H02M 5/4585* (2013.01); *H02M 7/219* (2013.01)

(58) Field of Classification Search
  USPC ........................................................ 318/490
  See application file for complete search history.

(56) References Cited

U.S. PATENT DOCUMENTS

| | | | |
|---|---|---|---|
| 7,525,824 | B2 | 4/2009 | Veenstra |
| 8,796,982 | B2 | 8/2014 | Li |
| 9,036,382 | B2 | 5/2015 | Li et al. |
| 9,124,245 | B2 | 9/2015 | Kerkman et al. |
| 9,252,601 | B2 | 2/2016 | Bo et al. |
| 2006/0186892 | A1 | 8/2006 | Hiramatsu et al. |
| 2010/0080022 | A1* | 4/2010 | Schmidt ................ H02M 7/062 363/53 |
| 2011/0292696 | A1* | 12/2011 | Xiao ....................... H02M 1/32 363/37 |
| 2012/0212982 | A1* | 8/2012 | Wei ..................... H02M 5/4585 363/37 |
| 2013/0106328 | A1* | 5/2013 | Kopiness ................ H02M 1/36 318/400.11 |
| 2013/0106331 | A1* | 5/2013 | Guzelgunler ........... H02P 29/02 318/400.21 |
| 2013/0221892 | A1 | 8/2013 | Hertz et al. |
| 2014/0003102 | A1* | 1/2014 | Kerkman ................ G01R 25/00 363/47 |
| 2014/0254217 | A1 | 9/2014 | Li et al. |
| 2014/0268953 | A1* | 9/2014 | Patel ...................... H02M 7/217 363/89 |
| 2016/0285381 | A1 | 9/2016 | Lai et al. |

FOREIGN PATENT DOCUMENTS

| | | |
|---|---|---|
| DE | 102005016720 A1 | 10/2006 |
| JP | S62100176 A | 5/1987 |
| JP | H0816258 A | 1/1996 |
| JP | H09247944 A | 9/1997 |
| JP | H09284985 A | 10/1997 |

OTHER PUBLICATIONS

Rodriguez, Pedro et al. literature titled "Grid Synchronization of Power Converters using Multiple Second Order Generalized Integrators", IEEE, 978-1-4244-1766, pp. 755-760, 2008.

Rodriguez, Pedro et al. literature titled "Multiresonant Frequency-Locked Loop for Grid Synchronization of Power Converters Under Grid Conditions", IEEE Transactions on Industrial Electronics, vol. 58, No. 1, pp. 127-138, Jan. 2011.

De Metz-Noblat, B., Cahier Technique No. 18, Schneider Electric Technical Collection, ECT18 first issue, Oct. 2005, 33 pgs.

Smith, Terrence, et al., "Detection of Loss of Voltage Phase", IEEE, 2013-PPIC-165, 5 pgs.

Refaat, Shady S., et al., "Detection and Discrimination Between Unbalanced Supply and Phase Loss in PMSM Using ANN-Based Protection Scheme", 2013 IEEE GCC Conference and Exhibition, Nov. 17-20, Doha, Qatar, pp. 430-434.

Baumann et al., "A novel control concept for reliable operation of a three-phase three-swich buck type unity power factor rectifier with integrated boost output stage under heavily unbalanced mains condition", PESC'03, 2003 IEEE 34th Annual Power Electronics Specialists Conference, vol. 1, Jun. 15, 2003, pp. 3-10.

European Search Report of European Application No. 17161290.6-1809 dated Jul. 17, 2017, 13 pgs.

* cited by examiner

PHASE LOSS DETECTION IN ACTIVE FRONT END CONVERTERS

BACKGROUND INFORMATION

The following relates to motor drivers, active front end power converters, and phase loss detection.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides methods and apparatus for phase loss detection.

Disclosed examples include a power conversion system, including an active rectifier circuit comprising a plurality of rectifier switching devices coupled to receive AC input power from an external power source and operative to provide a DC output according to a plurality of rectifier switching control signals. The system further includes a switching inverter comprising a plurality of inverter switching devices coupled to receive DC input power and operative to provide an AC output to drive a load according to a plurality of inverter switching control signals. The system includes a controller operative to generate the rectifier switching control signals to operate the rectifier switching devices, and to generate the inverter switching control signals to operate the inverter switching devices. The controller measures AC input voltages associated with AC input phases and determines grid currents. If the rectifier is not in a switching mode, the controller identifies a suspected AC input phase loss condition if two of the AC input voltage signals are in phase with one another, and if the rectifier is in the switching mode, the controller identifies the suspected AC input phase loss condition if the absolute value of a sum of two of the grid currents is less than a predetermined non-zero threshold.

DETAILED DESCRIPTION

Referring now in more detail to the figures, several embodiments or implementations are hereinafter described in conjunction with the drawings, wherein like reference numerals are used to refer to like elements throughout, and wherein the various features are not necessarily drawn to scale. Techniques and apparatus are disclosed for detection of phase loss in active front end converters. These aspects of the disclosure find utility in association with active front end (AFE) motor drives as well as other forms of power conversion systems. In addition, although illustrated in the context of three-phase input devices, the disclosed concepts can be employed in multiphase power conversion systems having any number of input phases.

Figure 1:
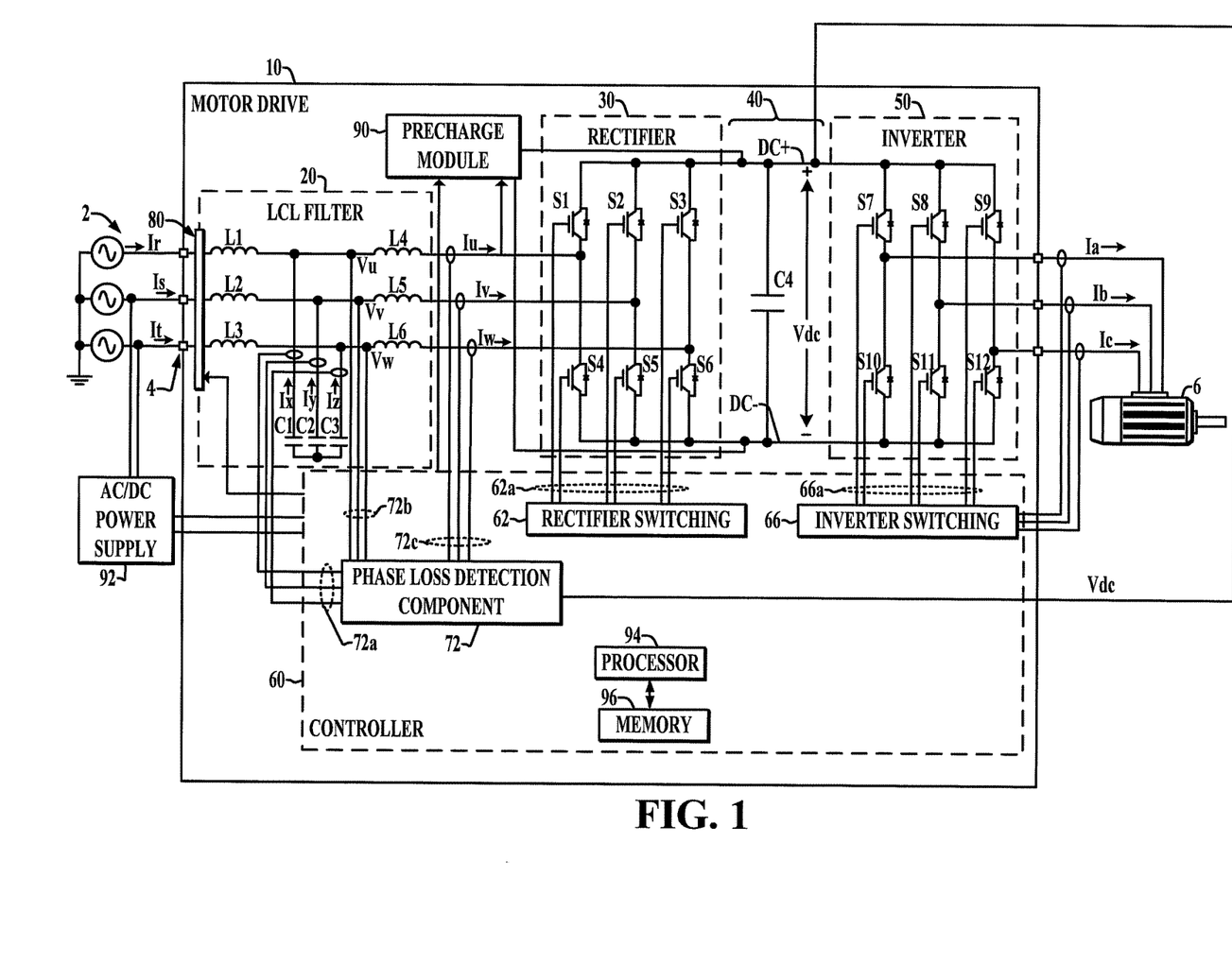
FIG. 1 is a schematic diagram illustrating an exemplary active front end (AFE) motor drive with an input LCL filter including a phase loss detection component in accordance with one or more aspects of the present disclosure.

FIG. 1 shows a three-phase source 2 providing power to a motor drive 10 to drive a motor load 6. The illustrated motor drive 10 includes an input filter circuit 20, an active or switching rectifier circuit 30 (alternately referred to as a converter), an intermediate DC bus circuit 40, an inverter 50, and a controller 60, as well as a precharge module or circuit 90 for precharging a bus capacitor C4 of the DC bus circuit 40, and a single phase power supply 92 for powering the controller 60. In other examples, the inverter 50 can be omitted, and the power conversion system includes an active front end rectifier 30 that provides a DC output for driving one or more loads, such as a plurality of inverters within a single system. In some configuration the AFE rectifier 30 is not connected to an inverter 50, and the AFE has a common DC bus output to which a user can connect any DC load or loads to receive DC input power from the AFE rectifier 30, sometimes referred to as an AFL Bus supply. The motor drive 10, in one example, operates in one of four modes. In the first mode, the rectifier 30 is powered, but a DC bus capacitor C4 of the DC bus circuit 40 is not yet precharged and a main breaker 80 is not closed. In a second mode, the DC bus capacitor C4 is precharged and the main breaker 80 is closed, but the rectifier 30 is not in a switching mode. In a third mode, the rectifier 30 is operating in a switching mode, and the motor drive 10 is operating in a light load condition. In a fourth mode, the rectifier 30 is operating in the switching mode, and the motor drive 10 is driving a heavy load.

The disclosed techniques and apparatus advantageously facilitate detection of loss of a phase from a three-phase power source, such as the three-phase source 2. Although illustrated in the context of a three-phase source 2, and a three-phase motor load 6, the disclosed techniques and apparatus can be employed in connection with other multi-phase systems having three or more input phases and/or three or more output phases. In certain examples, moreover, the techniques disclosed herein further allow for a determination of which particular phase has been lost. A phase loss is a condition different than a voltage sag, where phase loss implies that one of the AC input phases is completely disconnected from the motor drive 10. Thus, in a phase loss, the current in one phase is equal to zero. In certain examples, different techniques are used for detecting or identifying a suspected phase loss condition depending on the mode in which the motor drive 10 is operating. The controller 60 in certain examples is configured to generate an alarm or generate a message, or take other remedial action in response to identification of a suspected phase loss condition, or such remedial actions can be taken by an external system (not shown) in response to an alarm or message provided by the controller 60, for example, to implement a phase loss ridethrough program, to request maintenance personnel to inspect the input phases of the motor drive 10, to initiate a controlled shutdown of the drive 10, or other suitable actions.

FIG. 1 illustrates an example power conversion system, and this case a motor drive 10 with a three phase AC input 4 receiving input power from a three-phase source 2. As previously mentioned, the drive 10 includes a rectifier 30, an intermediate DC link circuit 40 and an output inverter 50 providing variable frequency, variable amplitude AC output power (e.g., motor currents Ia, Ib and Ic) to drive a motor load 6. The three-phase source 2 powers the motor drive 10 by way of grid currents Ir, Is and It. Although illustrated and described in the context of a motor drive type power conversion system 10, the various disclosed concepts can be employed in other forms of power conversion systems, whether providing an AC output or a DC output to drive a motor or other type of load. The drive input 4 has three input phase terminals which are connected through an LCL input filter circuit 20 to the AC input of the switching (e.g., active front end or "AFE") rectifier circuit 30, where the rectifier 30 receives AC input currents indicated as Iu, Iv and Iw in the drawing. The switching rectifier 30 includes switching devices S1-S6 individually coupled between a corresponding one of the AC input phases (u, v, w) and a corresponding DC bus terminal (+ or −) of the DC link circuit 40. In certain examples, the filter circuit 20 can be omitted.

The drive controller 60 includes a rectifier switching controller 62 that operates the rectifier 30 in a switching mode according to pulse width modulated (PWM) rectifier switching control signal 62a provided to the rectifier switches S1-S6 to cause the rectifier 30 to convert received three-phase AC input power to provide a DC voltage Vdc across a DC bus capacitor C4 of the link circuit 40 using any suitable pulse width modulation technique. The inverter 50 receives DC input power from the link circuit 40 and includes inverter switches S7-S12 individually coupled between one of the positive or negative DC bus terminals and a corresponding output phase coupled in this example to the motor load 6. In certain examples, the inverter outputs are connected directly to the leads of the motor load 6. In other examples, one or more intervening components may be connected between the output of the inverter 50 and the motor load 6, such as a filter and/or a transformer (not shown). The inverter switches S7-S12 are operated according to inverter switching control signals 66a provided by an inverter switching component 66 of the drive controller 60. The controller 60 generates the signals 66a according to any suitable pulse width modulation technique to convert DC power from the link circuit 40 to provide variable frequency, variable amplitude AC output power to drive the motor load 6. The switching rectifier 30 and the inverter 50 may employ any suitable form of switching devices S1-S12 including without limitation insulated gate bipolar transistors (IGBTs), silicon controlled rectifiers (SCRs), gate turn-off thyristors (GTOs), integrated gate commutated thyristors (IGCTs), etc.

As seen in the example of FIG. 1, the example LCL filter circuit 20 includes three series circuits individually connected between the power converter input 4 and the corresponding phase of the rectifier AC input. Each series circuit includes a pair of filter inductors, with the first circuit including inductor L1 connected to the first power converter input terminal and a second filter inductor L4 connected between L1 and the "U phase input of the rectifier 30". Similarly, the second series circuit includes a first inductor L2 connected to the second power converter input terminal and a second filter inductor L5. The third series circuit includes a first inductor L3 connected to the third power converter input terminal and a third filter inductor L6. In addition, the filter circuit 20 includes three capacitors C1, C2, C3 individually connected between a corresponding one of the filter phases and a common connection point, such as a neutral, as shown.

The controller 60 includes a phase loss detection component 72 is operative to take measurements regarding the LCL filter 20. Specifically, the phase loss detection component 72 receives one or more feedback signals representing operating parameters of the motor drive 10, including filter capacitor currents Ix, Iy and Iz, respectively flowing in the capacitors C1-C3, which are collectively indicated in the drawing as filter capacitor current feedback signals 72a. The phase loss detection component 72 in this example also measures or receives feedback signals representing the rectifier AC input voltages Vu, Vv and Vw; collectively indicated as signals 72b in FIG. 1. In one example, line voltages can be used, for instance, where phase voltages are not available. The phase loss detection component 72 in this example also measures or receives feedback signals representing currents Iu, Iv, Iw on the output side of the LCL filter 20, which are collectively indicated as signals 72c.

The controller 60 is powered in this example by an AC/DC power supply 92. The power supply 92 is powered by two phases of the three-phase source 2 to allow the controller 60 and other circuitry of the motor drive 10 to be powered prior to operation of the rectifier 30 and/or the inverter 50. The drive 10 also includes a main breaker 80 connected between the AC input terminals 4 and the filter circuit 20, which operates according to a control signal (not shown) from the controller 60. The controller 60 includes a processor 94 and an associated electronic memory 96. The controller 60 includes, executes and/or implements processor-executed software, processor-executed firmware, programmable logic, analog circuitry, etc., which provides the described computations, phase loss detection and threshold comparison functionality as set forth herein, and may be operative using one or more processor elements executing computer executable instructions stored in the electronic memory 96 of the controller 60.

As seen in FIG. 1, the controller 60 may include one or more components, which may be implemented as software and/or firmware components in execution, programmable logic, etc., including comparison logic operating to compare one or more computer calculated and/or measured values to one or more thresholds to facilitate detection of actual or suspected phase loss conditions. In addition, the controller 60 may provide an output signal (not shown) indicating that a phase is lost, and may also indicate which particular phase is lost. Thus, in one implementation, remedial action may be taken, such as shutting down the motor drive 10 and/or providing an alert or warning signal or other indication, for instance, to a user interface associated with the motor drive 10 and/or to a connected network (not shown).

In one example, the DC bus on the output side of the rectifier 30 is charged by precharge module 90. The precharge module 90 includes one or more resistors (not shown), which reduce the current into the DC bus circuit 40 to precharge the DC bus capacitor C4 in a controlled fashion, thus optimizing the precharging of the DC bus while mitigating or avoiding high inrush currents that would otherwise result from an initial operation of the switching rectifier 30 at power up or and other situations in which the DC bus capacitor C4 is initially uncharged or charged to a low voltage value. In one example, the controller 60 selectively operates the precharge module 90 to provide a current-limited charging path for conduction of current from the AC input source 2 for charging the DC bus capacitor C4 while monitoring the voltage Vdc across the capacitor C4 until the DC bus voltage reaches a predetermined value, after which the precharge module 90 is deactivated and the rectifier 30 can be operated in the active switching mode to control or regulate the DC bus voltage in the intermediate DC bus circuit 40.

The inventors have appreciated that identification of a suspected phase loss condition can be implemented in the different operating modes of the motor drive 10. As mentioned above, the example motor drive 10 operates in one of four different modes. In the second mode, the DC bus circuit 40 is precharged and the main breaker 80 is closed, but the rectifier 30 is not in the switching mode. In this mode (as with all modes), when the three-phase source 2 is working properly so that no phase is lost, each of the rectifier AC input voltage signals Vu, Vv, Vw will be 120 degrees out of phase relative to one another. However, when a phase is lost in the second mode, two of the rectifier AC input voltage signals will become in phase with one another, and typically will be offset from one another by a DC offset value of approximately Vdc/2. In one example, the controller 60 is operative if the rectifier circuit 30 is not in the switching mode, to identify a suspected AC input phase loss condition if two of the AC input voltage signals are in phase with one another.

In another example, if the active rectifier circuit 30 is in the switching mode, the controller 60 is operative to identify a suspected AC input phase loss condition if two of the AC input voltage signals are offset relative to one another other by a value of approximately half of a DC voltage measured on an output side of the active rectifier circuit 30 (e.g., Vdc/2). After an AC input phase connection is lost, the remaining two voltage signals will become in phase with one another, and the offset in amplitude from one another by a DC offset of approximately Vdc/2. For example, if phase v of the three phase power source 2 is lost, the following equations shall the voltage conditions at the input of the motor drive 10:

$$V_{un}^\backslash = V_{un};$$

$$V_{vn}^\backslash = \frac{-V_{vn}}{2} + \frac{V_{dc}}{2};$$

$$V_{wn}^\backslash = V_{wn};$$

$$V_{uv}^\backslash = V_{un}^\backslash - V_{vn}^\backslash = V_u - \left[\frac{-V_{vn}}{2} + \frac{V_{dc}}{2}\right];$$

$$V_{uv}^\backslash = V_{un}^\backslash - V_{vn}^\backslash = V_u + \frac{V_{vn}}{2} - \frac{V_{dc}}{2} = \frac{V_{un}}{2} - \frac{V_{wn}}{2} - \frac{V_{dc}}{2};$$

$$V_{wu}^\backslash = V_{wu};$$

$$V_{vw}^\backslash = V_{vn}^\backslash - V_{wn}^\backslash = \frac{-V_{vn}}{2} - \frac{V_{dc}}{2} - V_{wn} = \frac{-V_{vn}}{2} + \frac{V_{dc}}{2} - \frac{V_{wn}}{2} - \frac{V_{wn}}{2}; \text{ and}$$

$$V_{wu}^\backslash = \frac{V_{un}}{2} - \frac{V_{wn}}{2} + \frac{V_{dc}}{2},$$

where voltages without the superscript "\" refer to an input side of the breaker 80; and voltages with a superscript "\" refer to an output side of the breaker 80. If the DC components from the line voltages are removed, $V_{uv}^\backslash$ and $V_{vw}^\backslash$ will be in phase.

In the third mode, the rectifier 30 is operating in the switching mode, and the motor drive 10 is operating with the inverter 50 driving a light load. When an input phase is lost in this third mode, the remaining two grid currents will have approximately equal magnitude, but will flow in opposite directions (e.g. if the "u" phase is lost, Iv=−Iw). Accordingly, the controller 60 in one example operates such that if the active rectifier circuit 30 is in the switching mode, the suspected AC input phase loss condition is identified if an absolute value of a sum of two of the grid current signals is less than a predetermined non-zero threshold. In this regard, the controller 60 in one example computes the absolute value of the sum the feedback values of each pair of the sensed rectifier input currents (e.g., |Iu+Iv|, |Iv+Iw| and |Iw+Iu|), and compare each of these absolute values with a small threshold value, such as about 2% of a rated current, or 0.5% of a rated current, or other suitable value. A non-zero threshold advantageously avoids false identification of a phase loss condition when noise is present on the feedback signals Iu, Iv and/or Iw, and a suitably small value can be used such that the normal 120° phase offset of the phase currents will not result in a false phase loss identification even for low output load conditions of the motor drive 10.

In various implementations, the controller 60 can directly measure the grid currents Ir, Is and It to perform the above described phase loss detection functions, or may operate on other AC input currents, such as the rectifier input currents Iu, Iv and Iw as illustrated in FIG. 1. For example, in some examples, the grid currents Ir, Is, It are not measured directly (see, e.g., FIG. 1), and the controller 60 instead evaluates the grid currents with respect to phase loss conditions based on measurements of the capacitor currents Ix, Iy, Iz (also referred to as "cap" currents) and the rectifier AC input current signals Iu, Iv, Iw. As mentioned above, in the third mode, the motor drive is operating at a light load. At a light load, the capacitor currents Ix, Iy, Iz will have a large enough value relative to the AC input currents Iu, Iv, Iw, and the controller 60 in certain examples accounts for the capacitor currents Ix, Iy, Iz when calculating the grid currents Ir, Is, It. For example, the capacitor currents Ix, Iy, Iz may be 5 percent of the AC input currents Iu, Iv, Iw at light load conditions. Thus, in one example, the controller 60 is operative such that if the motor drive 10 is operating at a load less than or equal to a predetermined value, each grid current is determined by subtracting a capacitor current Ix, Iy, Iz from a measured AC input current Iu, Iv, Iw associated with the active rectifier circuit 30. In some examples, the predetermined value is 15 percent of a rated load of the motor drive 10. In this example, the motor drive 10 is operating at a light load if the load is less than 15 percent of a rated load of the motor drive. However, it should be appreciated that this is a non-limiting example, and other predetermined values can be used in other implementations.

In the fourth mode, as mentioned above, the rectifier 30 is operating in a switching mode, and the motor drive 10 is operating in a heavy load condition (e.g., above the predetermined value, such as above 15% of rated load). Furthermore, as with the third mode, when a phase is lost in the fourth mode, the remaining two grid currents will have approximately equal magnitude, but will flow in opposite directions (e.g. if the "u" phase is lost, Iu=−Iv). In the heavy load condition of the fourth mode, however, the capacitor currents Ix, Iy, Iz will be very small relative to the AC input currents Iu, Iv, Iw. Thus, in one example, the controller 60 is operative such that the grid currents Ir, Is, It are determined according to the AC input currents Iu, Iv, Iw if the motor drive 10 is operating at a heavy load.

In certain examples for the third and fourth modes, the grid currents Ir, Is, It are determined, such as by computation, and are not being directly measured. Thus, when a phase is lost the sum of the remaining two grid currents will only be approximately (not exactly) zero. Accordingly, in some embodiments, the controller 60 is operative such that the suspected AC input phase loss condition is identified if an absolute value of a sum of two of the grid current signals is less than a predetermined non-zero threshold. In other examples, the grid currents Ir, Is and It can be directly measured, with sensors providing feedback signals to the controller 60 to perform the above evaluations without need to offset for filter capacitor currents.

In other examples, the controller 60 evaluates the grid currents (e.g., directly, or determined grid current values based on the rectifier AC input currents Iu, Iv and Iw alone or in combination with filter capacitor current values Ix, Iy and Iz).

Once a suspected phase loss condition is identified, the controller 60 can implement one or more forms of remedial action. Non-limiting examples of remedial actions include: shutting down any components of the system such as the three-phase source 2 or the motor drive 10; sending an alert to a network such as the internet or any other computer network operatively coupled with the motor drive 10; sending a notification to a mobile device; displaying an alert on a display device; and creating an audible alert.

Figure 2:
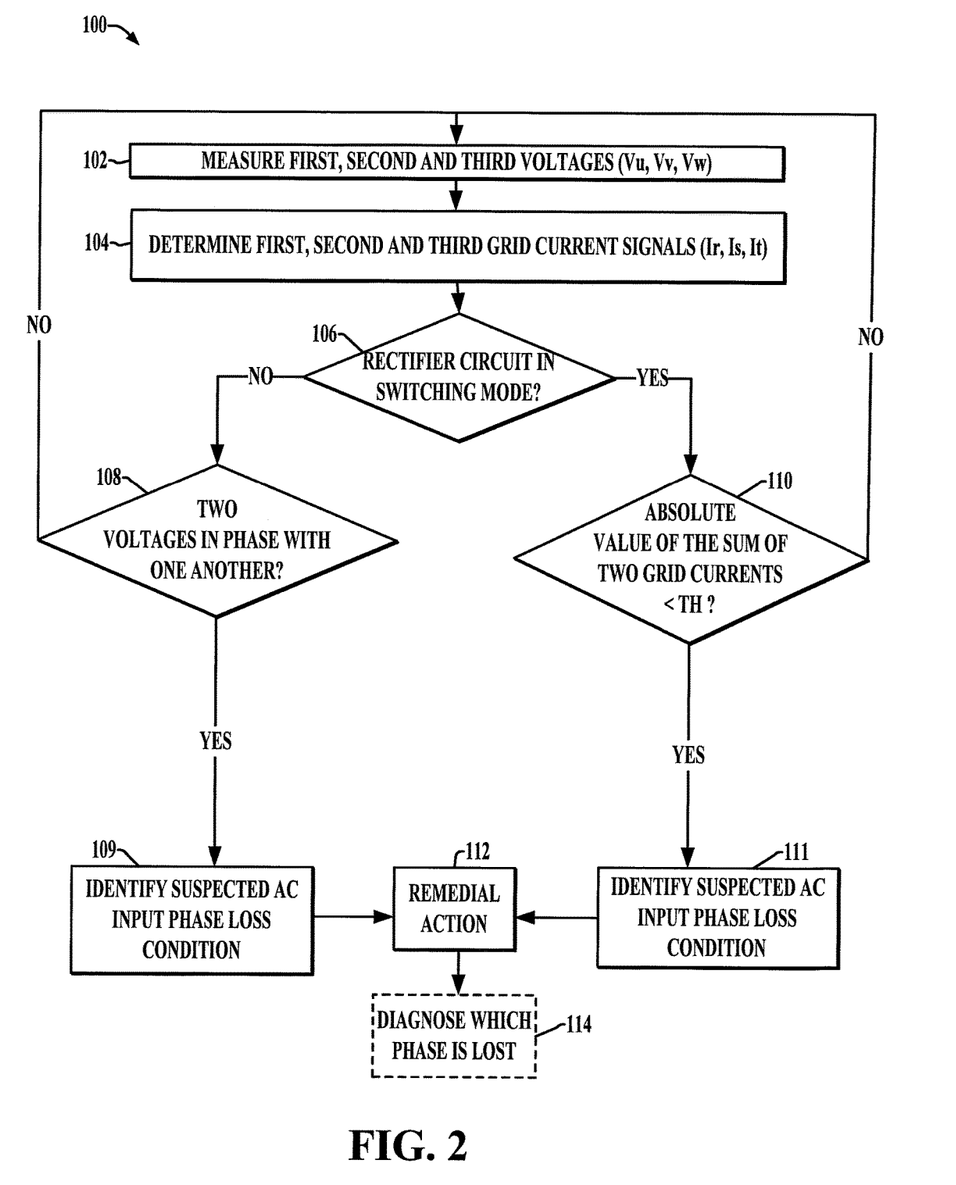
FIG. 2 is a flow diagram.

FIG. 2 illustrates a phase loss detection process 100 which can be implemented by the described controller 60 or other process are operatively associated with a power conversion system such as the motor drive 10. The process 100 includes measuring first, second and third line voltages Vuv, Vvw, Vwu at 102. In some examples, line voltages are measured and used. In other examples, phase voltages can be used, if available. At 104, first, second and third grid current signals Ir, Is, It are determined. At 106 a determination is made by the controller 60 as to whether the rectifier circuit 30 is in a switching mode. If the rectifier 30 is in the switching mode (YES at 106), the process 100 proceeds to 110, and otherwise (NO at 106), the process proceeds to 108. At 108, the controller 60 determines whether two of the line voltages Vuv, Vvw, Vwu are in phase with one another. If not (NO at 108), no phase loss condition is suspected, and the process returns to 102 as described above. If so (YES at 108), the process 100 proceeds to 109, where the controller 60 identifies a suspected AC input phase loss condition. If instead, the controller 60 determines that the rectifier 30 is operating in the switching mode (YES at 106), the controller 60 determines at 110 whether the absolute value of the sum of two of the grid current signals is less than a predetermined threshold TH. If so (YES at 110), the controller 60 identifies a suspected phase loss condition at 111, and otherwise (NO at 110) no phase loss is suspected and the process 100 returns to step 102. If a suspected phase loss condition is identified at 109 or 111, the controller 60 takes one or more remedial actions at 112. Optionally, at 114, the controller 60 provides a diagnosis as to which particular AC input phase has been lost.

Figure 3A:
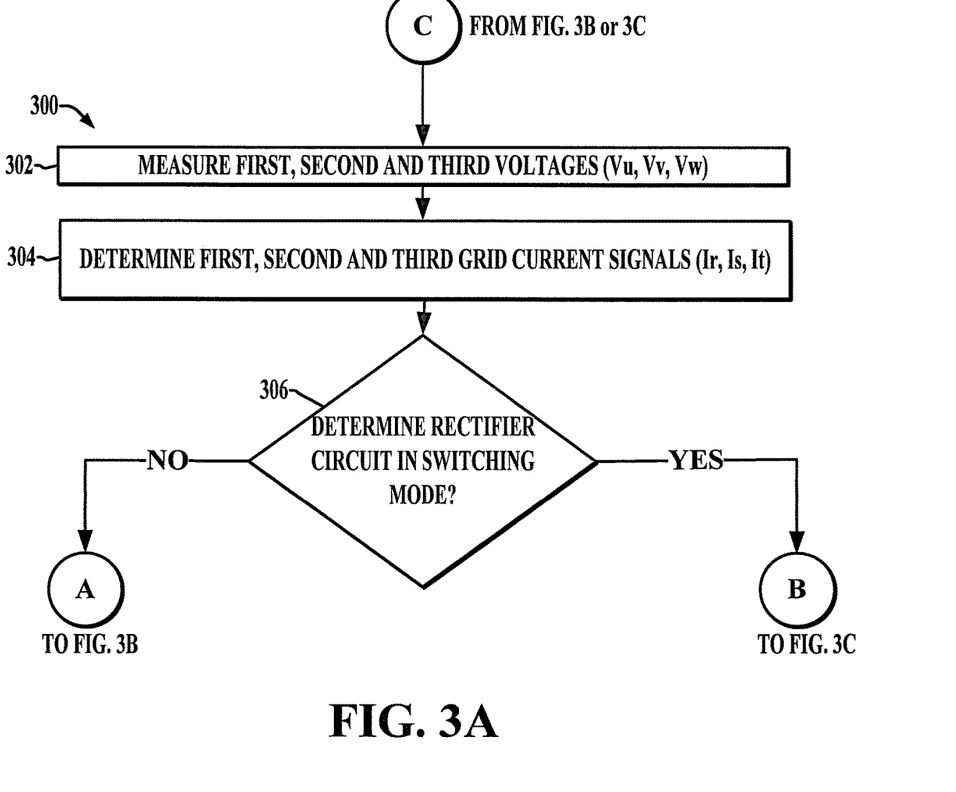
FIGS. 3A-3C depict a flow diagram.
Figure 3B:
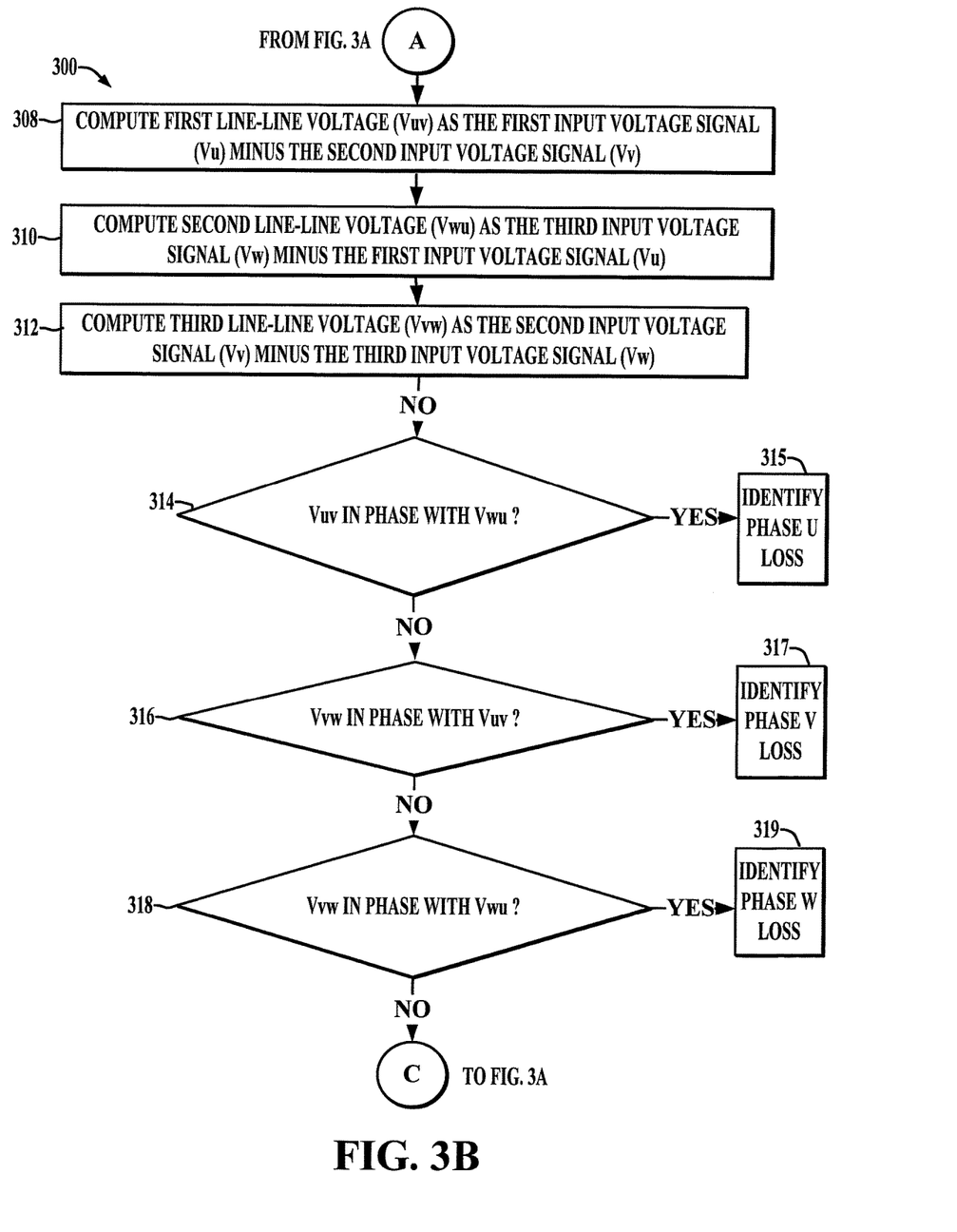
Figure 3C:
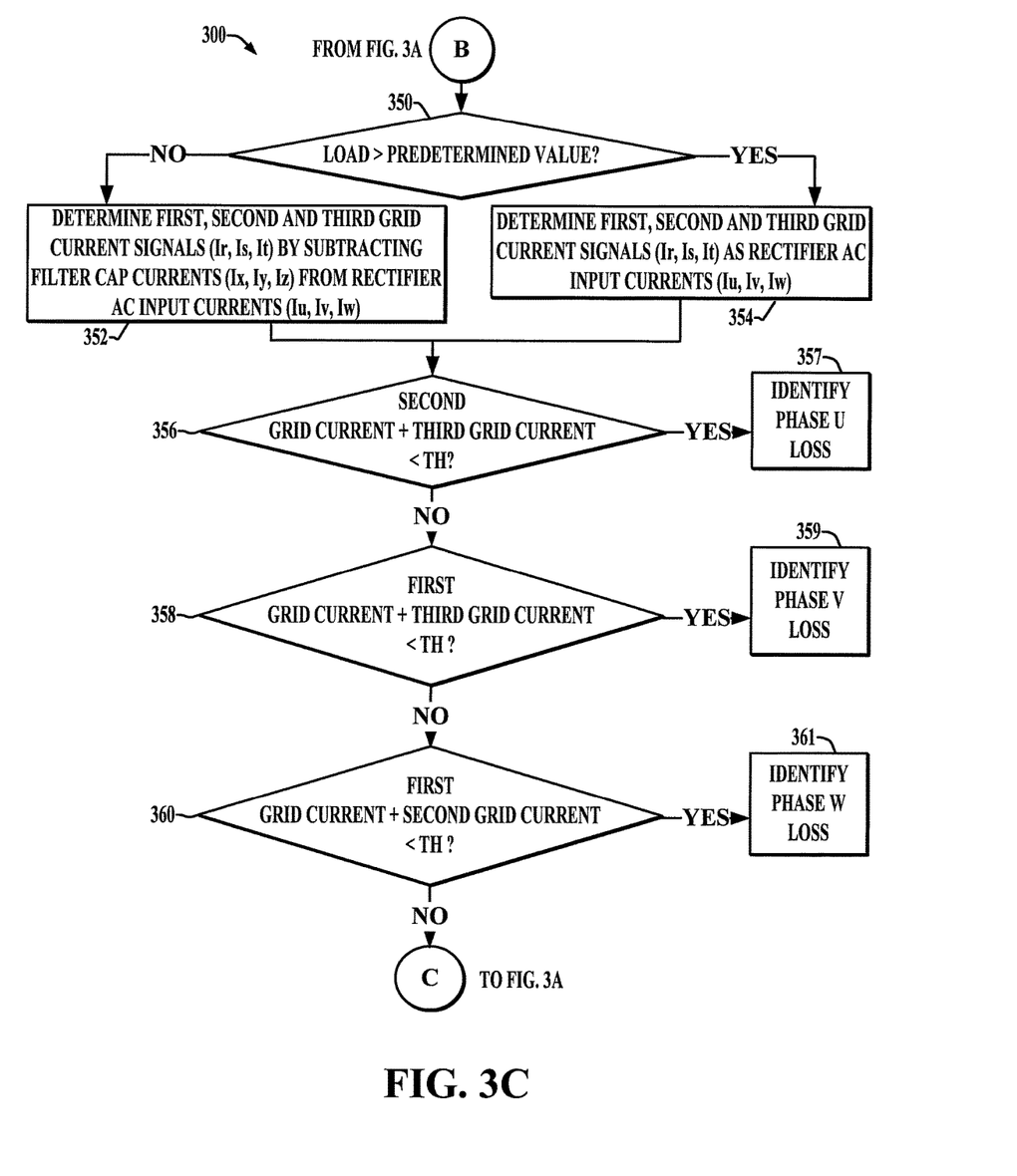

FIGS. 3A-3C show a more detailed process 300 which may be implemented by the controller 60. The process 300 includes measuring first, second and third line voltages Vu, Vv, Vw at 302 in FIG. 3A, and determining first, second and third grid current signals Ir, Is and It are determined at 304. At 306, the controller determines whether the rectifier circuit 30 is in the switching mode. If so (YES at 306) the process 300 proceeds to FIG. 3C, and otherwise (NO at 306), the process 300 proceeds to FIG. 3B.

At 308 in FIG. 3B, the controller 60 computes a first line-line voltage Vuv as the first input voltage signal Vu minus the second input voltage signal Vv. At 310, the controller 60 computes a second line-line voltage Vwu as the third input voltage signal Vw minus the first input voltage signal Vu. At 312, the controller 60 computes a third line-line voltage Vvw as the second input voltage signal Vv minus the third input voltage signal Vw. At 314, the controller 60 determines if the first line-line voltage Vuv is in phase with the second line-line voltage Vwu. If so (YES at 314), the controller 60 identifies a phase loss in phase u at 315. Otherwise (NO at 314), the process proceeds to 316 where the controller 60 determines if the third line-line voltage Vvw is in phase with the first line-line voltage Vuv. If so (YES at 316), the controller 60 identifies a suspected phase loss in phase v at 317. If not (NO at 316), the controller 60 determines at 318 whether the third line-line voltage Vvw is in phase with the second line-line voltage Vwu. If so (YES at 318), the controller 60 identifies a suspected phase loss in phase at 319 w, and otherwise (NO at 318) no suspected phase loss is identified and the process returns to step 302 shown in FIG. 3A.

Turning now to FIG. 3C, the process 300 is illustrated for rectifier operation in the switching mode continuing from 306 in FIG. 3A. At 350 in FIG. 3C, the controller determines at 350 whether the motor drive is operating a load greater than a predetermined value (e.g., 15% in one example as described above). If not (NO at 350), the controller 60 determines first, second and third grid current signals Ir, Is, It at 352 by subtracting filter capacitor currents Ix, Iy, Iz from the rectifier AC input currents Iu, Iv, Iw. If the load is greater than the predetermined value (YES at 350), the controller 60 determines first, second and third grid current signals Ir, Is, It at 354 as rectifier AC input currents Iu, Iv, Iw. In either case, the controller 60 determines at 356 whether the summation of the second grid current signal and the third grid current signal less is than a predetermined threshold TH. If so (YES at 356), a phase loss in phase u is determined at 357. If not (NO at 356), the controller 60 determines at 358 whether the summation of the first and third grid current signals is less than the threshold TH. For example, the summation of two remaining phases will generally be zero if a phase loss condition exists. This can be detected by determining whether the summation is less than a non-zero threshold TH. If so (YES at 358), the controller 60 identifies a suspected phase loss in phase v at 359. Otherwise (NO at 358), the controller 60 determines at 360 whether the summation of the first and second grid current signals is less than the predetermined threshold. If so (YES at 360), the controller 60 identifies a suspected phase loss in phase w at 361, and otherwise (NO at 360), the controller 60 returns to 302 in FIG. 3A. In one example, the process 300 is repeated in generally continuous fashion with the controller 60 performing the illustrated computations, comparisons, and evaluations based on one or feedback signals or values in order to continuously monitor the system four suspected phase loss conditions.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including," "includes," "having," "has," "with," or variants thereof are used in the detailed description and/or in the claims, such terms are intended to be inclusive in a manner similar to the term "comprising."

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. A power conversion system, comprising:
    an active rectifier circuit comprising a plurality of rectifier switching devices coupled to receive AC input power from an external power source and operative to provide a DC output according to a plurality of rectifier switching control signals; and
    a controller operative to:
        generate the rectifier switching control signals to operate the rectifier switching devices;
        measure a first AC input voltage signal associated with a first AC input phase, a second AC input voltage signal associated with a second AC input phase, and a third AC input voltage signal associated with a third AC input phase;
        determine a first grid current signal, a second grid current signal, and a third grid current signal;
        if the active rectifier circuit is not in a switching mode, identify a suspected AC input phase loss condition if two of the AC input voltage signals are in phase with one another; and
        if the active rectifier circuit is in the switching mode, identify the suspected AC input phase loss condition if an absolute value of a sum of two of the grid current signals is less than a predetermined non-zero threshold.

2. The power conversion system of claim 1, wherein the controller is further operative to:
    compute a first line-line voltage as the first AC input voltage signal minus the second AC input voltage signal;
    compute a second line-line voltage as the third AC input voltage signal minus the first AC input voltage signal; and
    if the active rectifier circuit is not in the switching mode, identify a suspected phase loss associated with the first AC input phase if the first line-line voltage is in phase with the second line-line voltage.

3. The power conversion system of claim 1, wherein the controller is further operative, if the power conversion system is operating at a load greater than a predetermined value, to:
    determine the first grid current signal according to a first AC input current associated with the active rectifier circuit;
    determine the second grid current signal according to a second AC input current associated with the active rectifier circuit; and
    determine the third grid current signal according to a third AC input current signal associated with the active rectifier circuit.

4. The power conversion system of claim 3, wherein the predetermined value is 15 percent of a rated load of the power conversion system.

5. The power conversion system of claim 1, wherein the controller is further operative, if the power conversion system is operating at a load less than or equal to a predetermined value, to determine each grid current by subtracting a capacitor current from a measured AC input current associated with the active rectifier circuit.

6. The power conversion system of claim 5, wherein the predetermined value is 15 percent of a rated load of the power conversion system.

7. The power conversion system of claim 1 wherein the controller is further operative, if the rectifier circuit is in the switching mode, to identify a suspected phase loss associated with the first AC input phase if a summation of the second grid current signal and the third grid current signal is less than a second predetermined non-zero threshold.

8. The power conversion system of claim 1 wherein the controller is further operative, if the active rectifier circuit is in the switching mode, to identify the suspected AC input phase loss condition if two of the AC input voltage signals are offset to each other by a value of half of a DC voltage measured on an output side of the active rectifier circuit.

9. A method to detect system phase loss in a motor drive, the method comprising:
    measuring a first AC input voltage signal associated with a first AC input phase, a second AC input voltage signal associated with a second AC input phase, and a third AC input voltage signal associated with a third AC input phase;
    determining a first grid current signal, a second grid current signal, and a third grid current signal;
    if an active rectifier circuit of the motor drive is not in a switching mode, identifying a suspected AC input phase loss condition if two of the voltage signals are in phase with one another; and
    if the active rectifier circuit is in the switching mode, identifying the suspected AC input phase loss condition if an absolute value of a sum of two of the grid current signals is less than a predetermined non-zero threshold.

10. The method of claim 9, comprising:
    computing a first line-line voltage as the first AC input voltage signal minus the second AC input voltage signal;
    computing a second line-line voltage as the third AC input voltage signal minus the first AC input voltage signal; and
    if the active rectifier circuit is not in the switching mode, identifying a suspected phase loss associated with the first AC input phase if the first line-line voltage is in phase with the second line-line voltage.

11. The method of claim 9, comprising:
    if the motor drive is operating at a load greater than a predetermined value:
        determining the first grid current signal according to a first AC input current associated with the active rectifier circuit;
        determining the second grid current signal according to a second AC input current associated with the active rectifier circuit; and
        determining the third grid current signal according to a third AC input current signal associated with the active rectifier circuit.

12. The method of claim 11, wherein the predetermined value is 15 percent of a rated load of the motor drive.

13. The method of claim 9, comprising, if the motor drive is operating at a load less than or equal to a predetermined value, determining each grid current by subtracting a capacitor current from a measured AC input current associated with the active rectifier circuit.

14. The method of claim 13, wherein the predetermined value is 15 percent of a rated load of the motor drive.

15. The method of claim 9, comprising, if the rectifier circuit is in the switching mode, identifying a suspected phase loss associated with the first AC input phase if a summation of the second grid current signal and the third grid current signal is less than a second predetermined non-zero threshold.

16. A non-transitory computer readable medium including computer readable instructions, which when executed by a processor, cause the processor to:
  measure a first AC input voltage signal associated with a first AC input phase of a power conversion system, a second AC input voltage signal associated with a second AC input phase of the power conversion system, and a third AC input voltage signal associated with a third AC input phase of the power conversion system;
  determine a first grid current signal, a second grid current signal, and a third grid current signal;
  if an active rectifier circuit of the power conversion system is not in a switching mode, identify a suspected AC input phase loss condition if two of the AC input voltage signals are in phase with one another; and
  if the active rectifier circuit is in the switching mode, identify the suspected AC input phase loss condition if an absolute value of a sum of two of the grid current signals is less than a predetermined non-zero threshold.

17. The non-transitory computer readable medium of claim 16, wherein the computer readable instructions, which when executed by a processor, further cause the processor to:
  compute a first line-line voltage as the first AC input voltage signal minus the second AC input voltage signal;
  compute a second line-line voltage as the third AC input voltage signal minus the first AC input voltage signal; and
  if the active rectifier circuit is not in the switching mode, identify a suspected phase loss associated with the first AC input phase if the first line-line voltage is in phase with the second line-line voltage.

18. The non-transitory computer readable medium of claim 16, wherein the computer readable instructions, which when executed by a processor, further cause the processor to:
  if the power conversion system is operating at a load greater than a predetermined value:
    determine the first grid current signal according to a first AC input current associated with the active rectifier circuit;
    determine the second grid current signal according to a second AC input current associated with the active rectifier circuit; and
    determine the third grid current signal according to a third AC input current signal associated with the active rectifier circuit.

19. The non-transitory computer readable medium of claim 18, wherein the predetermined value is 15 percent of a rated load of the power conversion system.

20. The non-transitory computer readable medium of claim 16, wherein the computer readable instructions, which when executed by a processor, further cause the processor to, if the power conversion system is operating at a load less than or equal to a predetermined value, determine each grid current by subtracting a capacitor current from a measured AC input current associated with the active rectifier circuit.

21. The non-transitory computer readable medium of claim 20, wherein the predetermined value is 15 percent of a rated load of the power conversion system.

22. The non-transitory computer readable medium of claim 16, wherein the computer readable instructions, which when executed by a processor, further cause the processor to, if the rectifier circuit is in the switching mode, identify a suspected phase loss associated with the first AC input phase if a summation of the second grid current signal and the third grid current signal is less than a second predetermined non-zero threshold.

* * * * *